(12) United States Patent
Brinkis et al.

(10) Patent No.: US 6,683,525 B2
(45) Date of Patent: Jan. 27, 2004

(54) ELECTRICAL STRAIN SENSITIVE RESISTOR

(75) Inventors: Waldemar Brinkis, Nidderau (DE); Erich Mattmann, Heidesheim (DE)

(73) Assignee: Siemens AG, Munich (DE)

(*) Notice: Subject to any disclaimer, the term of this patent is extended or adjusted under 35 U.S.C. 154(b) by 47 days.

(21) Appl. No.: 10/094,502

(22) Filed: Mar. 8, 2002

(65) Prior Publication Data
US 2002/0130756 A1 Sep. 19, 2002

(30) Foreign Application Priority Data
Mar. 17, 2001 (DE) .......................... 101 13 474

(51) Int. Cl.⁷ .............................. G01L 1/22
(52) U.S. Cl. ................. 338/2; 338/5; 338/309
(58) Field of Search ................. 338/2, 3, 4, 6, 338/309, 30, 64

(56) References Cited

U.S. PATENT DOCUMENTS

| | | | | |
|---|---|---|---|---|
| 4,758,816 A | * | 7/1988 | Blessing et al. | 338/314 |
| 4,827,769 A | * | 5/1989 | Riley et al. | 73/313 |
| 5,242,722 A | * | 9/1993 | Hiraka et al. | 428/34.6 |
| 5,898,359 A | * | 4/1999 | Ellis | 338/47 |
| 6,233,817 B1 | * | 5/2001 | Ellis et al. | 29/832 |
| 6,512,445 B1 | * | 1/2003 | Schafert et al. | 338/2 |

FOREIGN PATENT DOCUMENTS

| | | |
|---|---|---|
| DE | 3431114 | 3/1986 |
| DE | 19706790 | 9/1998 |
| DE | 19747001 | 5/1999 |

* cited by examiner

Primary Examiner—Karl D. Easthom
(74) Attorney, Agent, or Firm—Martin A. Farber

(57) ABSTRACT

An electrical circuit having at least one electrical component, in particular a strain-sensitive resistor and conductor tracks which are applied to a metallic carrier with the intermediate positioning of at least one insulating layer, at least one further conductor track, which is connected to at least one conductor track of the circuit, is applied to the surface of the metallic carrier. The invention also relates to methods for manufacturing the electrical circuit.

6 Claims, 1 Drawing Sheet

ELECTRICAL STRAIN SENSITIVE RESISTOR

FIELD AND BACKGROUND OF THE INVENTION

The invention relates to an electrical circuit having at least one electrical component, in particular a strain-sensitive resistor, and conductor tracks which are applied to a metallic carrier with the intermediate positioning of at least one insulating layer.

An electrical circuit which is used essentially as a strain gauge has been disclosed, for example, by DE 197 47 001 C2. Sensors with strain gauges are used, inter alia, in motor vehicles, for example for measuring the torque at the steering wheel. However, in such sensors stringent requirements are made in terms of the electromagnetic compatibility.

SUMMARY OF THE INVENTION

The object of the present invention is therefore to improve the known electrical circuit in terms of the electromagnetic compatibility.

This object is achieved according to the invention in that at least one further conductor track is applied to the surface of the metallic carrier and is connected to at least one conductor track of the circuit.

The circuit according to the invention has the advantage that the metallic carrier, in particular the steel carrier, is used as a grounding layer. In addition, the circuit according to the invention has the advantage that thermal stressing of the steel associated with the application of further layers is avoided because said steel is electrically conductive and thus serves itself as a grounding layer. As a result of the avoidance of the additional thermal loading, the steel maintains its mechanical strength values, in particular pulling strength, tensile strength and breaking strength.

In order to bring about a secure connection between the circuit and the steel substrate, one advantageous refinement of the invention provides for the at least one further conductor track to be arranged between the at least one insulating layer and the metallic carrier, and for at least one conductive feedthrough to be provided from the further conductor track to the at least one conductor track.

Another advantageous refinement advantageously safeguards this connection by virtue of the fact that the at least one further conductor track is applied to the metallic carrier next to the at least one insulating layer, and that the at least one further conductor track is connected to the at least one conductor track using a connecting conductor track which runs over the surface of the at least one insulating layer.

The invention can also be applied in metallic carriers composed of materials other than steel. The conductor tracks are preferably composed of silver. However, other conductive materials, in particular gold, silver platinum, silver palladium or copper are also suitable.

One advantageous method for manufacturing the first embodiment takes the form of the at least one further conductor track being applied on the metallic carrier as a low-impedance conductor track paste, the at least one insulating layer then being applied as a dielectric paste leaving vias exposed, and the at least one conductor track which is to be connected to the further conductor track being then applied with a conductor track paste which penetrates the vias.

The second embodiment can preferably be manufactured by applying the at least one insulating layer on the metallic carrier leaving exposed the surface which is provided for the further conductor track, and a low-impedance conductor track paste being then applied to the surfaces which are provided for the conductor tracks and for the at least one further conductor track, including the connecting conductor track.

BRIEF DESCRIPTION OF THE DRAWING

The invention permits numerous embodiments. One of them is illustrated schematically in the drawing with reference to a plurality of figures and described below. In said drawing.

DETAILED DESCRIPTION OF THE PREFERRED EMBODIMENT

Figure 1:
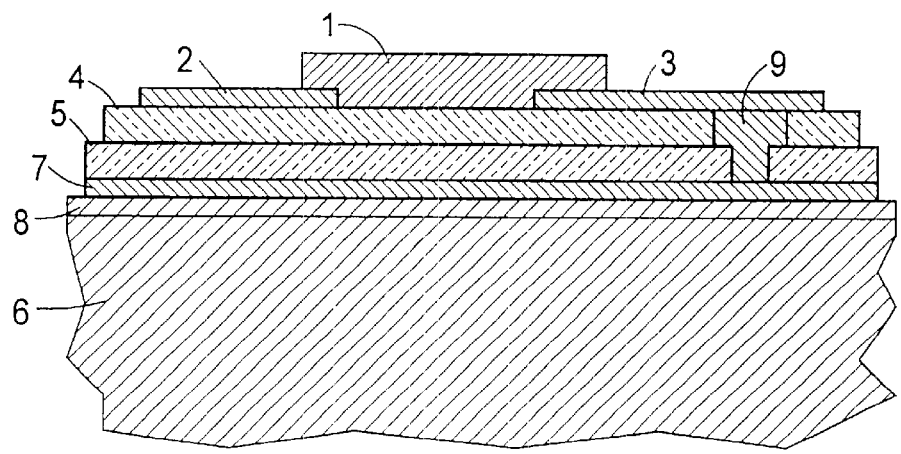
FIG. 1 shows a first exemplary embodiment.

Identical parts are provided with identical reference symbols in the figures. The figures each show details of enlarged sectional views in which, in particular, the layer thicknesses are illustrated in a highly magnified form.

A strain-sensitive resistor 1 is connected to two conductor tracks 2, 3. These are applied to an insulating layer 4, which is in turn supported on a further insulating layer 5. A steel carrier 6 has, on the surface, an oxide layer 8 which is due to the fabrication processes and is merely indicated in the figures.

In the exemplary embodiment according to FIG. 1, a conductor track is applied to the carrier 6 in that a conductor track paste is firstly pressed on and then fired at a high temperature. During the firing process, silver atoms penetrate the oxide layer so that it is "cracked". This provides a good conductive connection between the carrier 6 and the conductor track 7. The insulating layers 4 and 5 have holes which are penetrated by conductor track paste when the conductor track 3 is applied, thus bringing about a conductive connection between the conductor track 7 and the conductor track 3.

Figure 2:
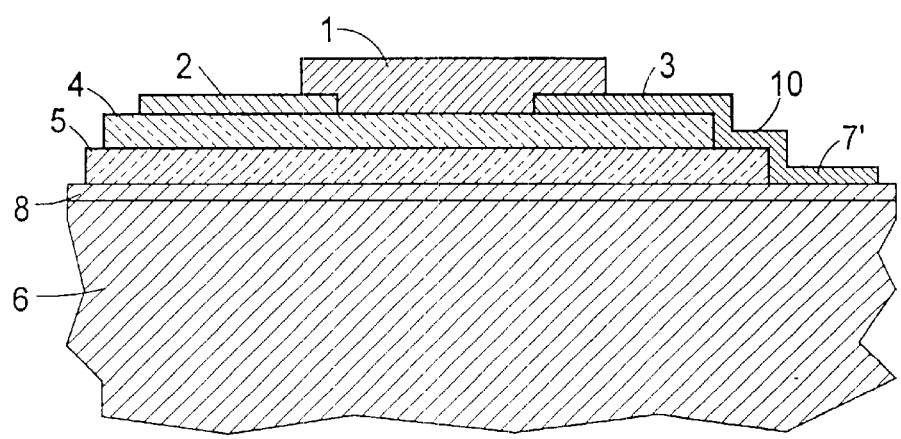
FIG. 2 shows a second exemplary embodiment.

In the exemplary embodiment according to FIG. 2, just one conductor track 7', running along the edge of the insulating layer 5, and connected to the conductor track 3 via a connecting conductor track 10, is provided in order to make contact with the carrier 6. The conductor tracks 3, 7' and 10 can easily be manufactured, as can the conductor track 2, in one operation.

We claim:
1. An electrical circuit comprising
   a strain-sensitive resistor connected to conductor tracks, the conductor tracks being applied to at least one insulating layer and the insulating layer being applied to a metallic carrier, wherein
   at least one further conductor track (7, 7') is applied to the surface of the metallic carrier (6) and is connected to at least one of said conductor tracks (3) of the circuit, wherein
   the at least one further conductor track (7) is arranged between the at least one insulating layer (4, 5) and the metallic carrier (6), and at least one conductive feedthrough extends from the further conductor track (7) to the at least one conductor track (3).
2. The electrical circuit as claimed in claim 1, wherein the at least one further conductor track (7') is applied to the metallic carrier (6) next to the at least one insulating layer (4,

5), and the at least one further conductor track (7') is connected to the at least one conductor track (3) using a connecting conductor track which runs over the surface of the at least one insulating layer (4, 5).

3. The electrical circuit as claimed in claim 1, wherein the metallic carrier (6) is made of steel.

4. The electrical circuit as claimed in claim 1, wherein the at least one further conductor track (7, 7') is made of silver.

5. An electrical comprising
   a strain-sensitive resistor connected to conductor tracks, the conductor tracks being applied to at least one insulating layer and the insulating layer being applied to a metallic carrier, the metallic carrier is mechanically stressed and a strain from said mechanical stress is measured by the strain-sensitive resistor, wherein
   at least one further conductor track (71, 7') is applied to the surface of the metallic carrier (6) and is connected to at least one of said conductor tracks (3) of the circuit.

6. The electrical circuit as claimed in claim 5, wherein the at least one further conductor track (7) is arranged between the at least one insulating layer (4, 5) and the metallic carrier (6), and at least one conductive feedthrough extends from the further conductor track (7) to the at least one conductor track (3).

* * * * *